United States Patent [19]

Bouvier et al.

[11] 4,031,462
[45] June 21, 1977

[54] FREQUENCY SPECTRUM ANALYZER

[75] Inventors: David William Bouvier; William Geary Green, both of Tempe; Randolph Gaylon Moore, Phoenix, all of Ariz.

[73] Assignee: Motorola, Inc., Schaumburg, Ill.

[22] Filed: July 7, 1975

[21] Appl. No.: 593,830

[52] U.S. Cl. .......................... 324/77 B; 324/77 G; 328/167

[51] Int. Cl.² .......................................... G01R 23/16

[58] Field of Search ............ 324/77 R, 77 A, 77 B, 324/77 C, 77 CS, 77 G, .5 AC; 328/167

[56] References Cited

UNITED STATES PATENTS

| | | | |
|---|---|---|---|
| 3,065,419 | 11/1962 | Markson et al. | 324/77 G |
| 3,566,035 | 2/1971 | Noll | 324/77 B |
| 3,674,998 | 7/1972 | Benz | 324/77 B |
| 3,728,623 | 4/1973 | Dubois | 324/77 B |
| 3,803,390 | 4/1974 | Schaepman | 324/77 B |

*Primary Examiner*—Rudolph V. Rolinec
*Assistant Examiner*—Michael J. Tokar
*Attorney, Agent, or Firm*—Eugene A. Parsons

[57] ABSTRACT

A system is disclosed for analyzing in real time the frequency spectrum of an incoming signal of unknown frequency characteristics. This is accomplished by first generating a train of sampling pulses in repetitive frames, where each frame of pulses represents a series of cross-correlation functions in terms of a predetermined number of sampling intervals and a predetermined number of harmonics. These sampling pulses are then multiplied with the incoming signal to generate a train of discrete sampled outputs. The discrete sampled outputs from the multiplying means are accumulated in an accumulator and a frequency domain output signal is produced for each frame of sampling pulses.

18 Claims, 8 Drawing Figures

FREQUENCY SPECTRUM ANALYZER

BACKGROUND OF THE INVENTION

Frequency spectrum analyzers have been used for many years to transform a time domain signal of unknown frequency characteristics into a frequency spectrum output such that the frequency components of the incoming signal can be determined. Typically a system performs a Fourier transform on the time domain signal to translate that signal into a frequency spectrum output. First the apparatus samples the incoming time domain signal for a predetermined number of intervals and stores each sample of the input signal in a storage device or memory. The apparatus then performs a Fourier transform on these stored samples of the incoming signal and at the end of this processing interval an output in frequency spectrum form is generated. After each processing cycle is completed the spectrum analyzer again samples the incoming signal, stores that data, and then performs the Fourier transform on the stored signal data.

The difficulty with this arrangement is that the incoming signal must be disregarded for a period of time following each period of signal sampling to allow time for processing the stored samples of the input signal. During the processing interval the incoming signal must be disregarded even though it may have radically changed in frequency content. These devices cannot properly be characterized as real time frequency spectrum analyzers since there are gaps between signal sampling periods to allow processing of the stored signal.

Other problems associated with prior art frequency spectrum analyzers are that they are large, bulky and expensive, often utilizing standard large capacity digital computers to process the information. In addition these devices consume large amounts of power.

SUMMARY OF THE INVENTION

It is an object of the invention to provide a frequency spectrum analyzer operating in real time where the time interval between each discrete sample of the incoming signal is uniform and where no interval longer than this uniform time interval between discrete samples is needed to provide time for signal processing.

It is another object of the invention to provide a relatively inexpensive, miniaturized apparatus for analyzing in real time the frequency spectrum of an incoming signal of unknown frequency characteristics.

It is yet another object of the invention to provide a simplified, large capacity apparatus for analyzing in real time the frequency spectrum of an incoming signal of unknown frequency characteristics.

It is a further object of the invention to provide a high speed, high accuracy apparatus for analyzing in real time the frequency spectrum of an incoming signal of unknown frequency characteristics.

It is still another object of the invention to provide a frequency spectrum analyzer which allows multi-channel processing of the unknown incoming signal for the purpose of providing a more reliable and more accurate frequency spectrum output.

Briefly described, the invention provides a code generator responsive to a timing signal to generate a series of repetitive frames of sampling pulses. Each frame of sampling pulses is defined by a two dimensional sample weighting matrix. The sample weighting matrix is formed by digitally approximating a series of harmonically related cross-correlation functions. Each column of the sample weighting matrix corresponds to a different sampling interval, while each row corresponds to a different harmonic of the cross-correlation function. During each sampling interval the code generator scans one column of the sample weighting matrix to generate a series of harmonically related cross-correlation functions. During the next sampling interval, the code generator scans the next column of the sample weighting matrix to produce the subsequent series of cross-correlation functions. After a predetermined number of sampling intervals, all the columns of the sample weighting matrix will have been scanned. The code generator then returns to the first column of the sample weighting matrix where another scan of the sample weighting matrix begins.

Each sampling pulse produced by the code generator is a function of the sampling interval and the harmonic of the cross-correlation function. The unknown incoming signal and the sampling pulses from the code generator are multiplied together in a multiplier which produces a train of discrete sampled outputs. The train of discrete sampled outputs produced during each sampling interval is stored in an accumulating device which is also responsive to the timing signal. During the sampling interval immediately following the scan of the last column of the sample weighting matrix the accumulating device switches its accumulated contents to an output. The output of the accumulator during this sampling interval represents the desired frequency spectrum output. An updated frequency spectrum output is generated for each frame of sampling pulses.

According to a feature of the invention the aforementioned approach to analyzing the frequency spectrum of an incoming signal of unknown frequency characteristics is advantageously applied to obtain frequency spectrum information in single channel as well as in multichannel apparatus.

The foregoing and other objects, features and advantages of the invention will be apparent from the following detailed description of illustrative embodiments of the invention in conjunction with the accompanying drawings.

DETAILED DESCRIPTION

Figure 1:
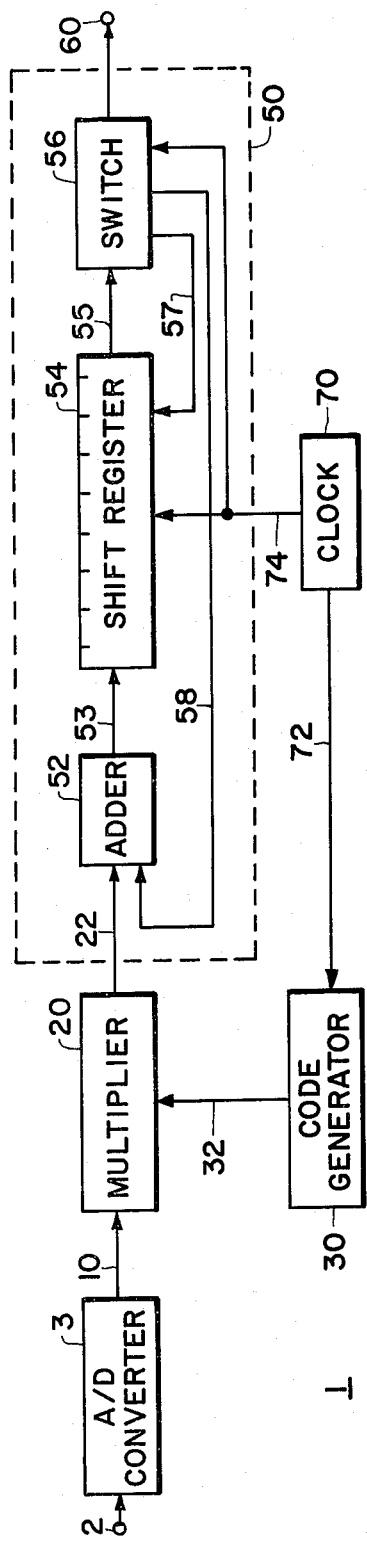
FIG. 1 is a schematic diagram of a single channel frequency spectrum analyzer according to the invention.

The purpose of the apparatus shown in FIG. 1 is to analyze in real time the frequency spectrum of an incoming time domain signal of unknown frequency characteristics. The apparatus utilizes a method of cross-correlating an input signal of unknown frequency characteristics with a series of signals of known frequency to determine the approximate frequency characteristics of the unknown incoming signal. This apparatus does not use a precise implementation of any particular mathematical model although its method of operation in this particular embodiment closely resembles that of a Discrete Fourier Transform. The approximation used yields a very accurate result with respect to frequency resolution even though it does not emulate any precise mathematical procedures. The unknown incoming signal is cross-correlated with a series of sinusoidal waves of known frequency to arrive at an output in frequency spectrum form. This method of cross-correlation is described in terms of using a sine wave cross-correlation function; it is however to be understood that other suitable forms of cross-correlation functions such as a chirped sine wave or a square wave could be used.

Cross-correlation refers to the multiplication of one unknown time domain signal with a series of signals of known frequency where each product is then integrated over a fixed time period. If the two signals have nothing in common the average output is 0. If the two signals have a common frequency element during the time in which the integration occurs, the output will be greater than 0. In this apparatus the integration occurs over a finite rather than an infinite time period.

FIG. 1 shows a functional block diagram of an embodiment of the real time frequency spectrum analyzer according to the invention. The operation of the present preferred embodiment will be shown later by referring to FIG. 6. As illustrated in FIG. 1, the real time frequency spectrum analyzer 1 includes an analog-to-digital converter 3, multiplier 20, accumulator 50, code generator 30 and clock 70. Analog-to-digital converter 3 is interposed between input node 2 and multiplier 20. Code generator 30 receives timing signals from clock 70 through a path 72 and transmits its output signal to multiplier 20 through a path 32. Accumulator 50 receives its timing signals from clock 70 by means of path 74. The output of multiplier 20 is connected to accumulator 50 by means of conductor 22. The output in frequency spectrum form of frequency spectrum analyzer 1 is provided at output terminal 60.

A step by step analysis of the function of this apparatus will now be undertaken. First the operation of code generator 30 as shown in FIG. 1 will be detailed. The operation of code generator 30 can best be understood by reference to FIG. 2 which shows a sample weighting matrix for code generator 30 composed of a matrix of M rows and K columns of weighting numbers. M is analogous to the number of Fourier frequencies which will be used for the cross-correlation functions, while K is analogous to the number of sampling intervals over the Fourier interval. M and K correspond to the coefficients used in the Discrete Fourier Transform approximation of the Fourier transform. Code generator 30 generates an output every $\tau$ seconds in response to clocking pulses from clock 70. $\sigma$ represents the time separation of the discrete samples which are to be taken.

Figure 2:
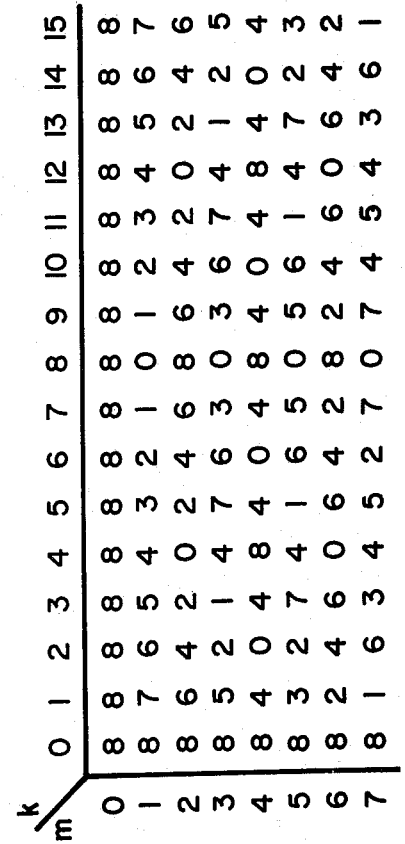
FIG. 2 is an illustration of a very small sample weighting matrix for the code generator.

For the sample weighting matrix illustrated in FIG. 2, 16 different sampling intervals (K=16) are required to complete one frame of sampling pulses. Each value of k designates a column of the sample weighting matrix and corresponds to a particular interval of time during which the incoming signal is sampled. Each value of m designates a row of the sample weighting matrix and corresponds to a particular harmonic frequency of the cross-correlation signal which is to be multiplied with the unknown incoming signal.

Each value of m designates one of a family of harmonically related sine waves which is used as the cross-correlation signal. In FIG. 2, m varies in value from 0 through 7. For m=0 it will seen that for any value of k between 0 and 15 all cross-correlation coefficients will have a weight or amplitude of 8. This represents the DC level. For m=1, it will be seen that as the value of k increases the cross-correlation coefficients vary from 8 to 0 and back up to 7 again. This represents a quantized approximation of one cycle of a sine wave with a frequency of 100 Hz. m=2 designates a cross-correlation function of frequency 200 Hz. m=3 designates a cross-correlation function of frequency 300 Hz. This pattern continues for the remaining values of m.

Figure 3:
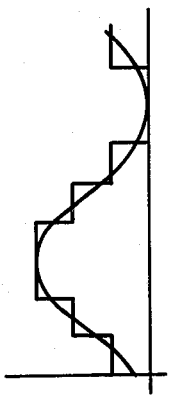
FIG. 3 shows waveforms that demonstrate how a four level digital approximation of a cross-correlation function is produced.

From the foregoing it is evident that the sine waves which are used in this apparatus to cross-correlate the unknown incoming signal are not true sine waves but are merely digital approximations of sine waves. They are represented by a two bit word with four possible levels. FIG. 3 shows what a four level digital approximation of a sine wave looks like. If one reads the cross-correlation coefficients horizontally across the matrix shown in FIG. 2 for a value of, say, m=1 and plots their magnitude with respect to time it will be seen that the shape of the plot roughly approximates a sine wave. This is illustrated in FIG. 3. This approximation introduces some error but it comes close enough to a true sine wave that using it gives good results with respect to the accuracy of the frequency spectrum output. Improving the accuracy of the digital sine wave approximation by using six or eight levels instead of four as shown results in only minimal increases in accuracy of the frequency spectrum output.

An illustrative example of the operation of frequency spectrum analyzer 1 can now be detailed by reference to FIG. 1. The incoming signal enters at node 2. Analog-to-digital converter 3 is used to hard limit the amplitude of the incoming signal to either a one level or a zero level. The resulting pulsed output of analog-to-digital converter 3 is fed to multiplier 20 by means of conductor 10. As pulses of the unknown incoming signal enter multipilier 20 during the first sampling interval, code generator 30 generates the cross-correlation coefficients picked up during a scan of the first column of the sample weighting matrix. During sample interval k=0, code generator 30 sequentially generates all cross-correlation coefficients in the k=0 column of the sample weighting matrix. If k were equal to 2 in FIG. 2, for instance, the output of code generator 30 during that sampling interval would be represented by the following cross-correlation coefficients: 8, 6, 4, 2, 0, 2, 4, 6. The discrete sampled outputs of multiplier 20 during any particular sampling interval will be the products of the cross-correlation coefficients coming from code generator 30 and the hard limited unknown incoming signal coming from analog-to-digital converter 3. Due to the varying magnitudes of the cross-correlation coefficients and the unknown incoming signal, the outputs from multiplier 20 will be a series of pulses of different magnitudes.

The unknown incoming signal changes so slightly during one sampling interval that signal variations are not significant. The sampling rate must be scaled to the anticipated rate of change of the incoming signal to ensure that this criterion is met. The sampling rate is a design parameter that can be built into the code generator and once set it would not be varied during the operation of the apparatus.

The train of discrete sampled outputs from multiplier 20 is now sent to accumulator 50 by conductor 22. The accumulator 50 includes adder 52, shift register 54, and switch 56 operatively connected in series. Adder 52 and shift register 54 are used as a digital integrator. During the sampling interval following each sample weighting matrix frame switch 56 resets shift register 54 to zero. Conductor 57 transmits this reset instruction to shift register 54.

Shift register 54 is of a conventional design that is able to sequentially accumulate and store outputs of multiplier 20 in a series of storage locations or "bins" during each frame of sampling intervals. Clock 70 cycles code generator 30 and shift register 54 simultaneously to ensure that each discrete sampled output of multiplier 20 is properly clocked into the storage bin corresponding to the harmonic frequency with which the unknown incoming signal has just been correlated. The value of $m$ in the sample weighting matrix designates the harmonic with which the unknown incoming signal is correlated and the bin in which each discrete sampled output will be accumulated.

In operation, during the first sampling interval $k=0$, each discrete sampled output of multiplier 20 is stored in a separate bin in shift register 54 as each value of $m$ is cycled. During sampling interval $k=1$, each discrete sampled output is added to its corresponding term in each bin of shift register 54 as shift register 54 and code generator 30 are simultaneously cycled through each value of $m$. For each value of $k$, code generator 30 completes one vertical scan of the sample weighting matrix and each storage bin in accumulator 54 receives an updated input.

During this accumulation process, the output of shift register 54 enters switch 56 via path 55. In this mode switch 56 operates to sequentially transmit the output of each bin of shift register 54 to feedback line 58. Adder 52 adds the previous contents of each bin of shift register 54 coming from feedback line 58 with each discrete sampled output of multiplier 20 such that the sum in each bin of shift register 54 is kept up to date. In this manner each bin in shift register 54 is used to accumulate the discrete sampled outputs of multiplier 20 which correspond to a selected harmonic of the cross-correlation signal over each sampling interval until each matrix frame is completed.

Shift register 54 completes one full cycle during each sampling interval. All discrete sampled outputs produced by the multiplication of the cross-correlation coefficients from one row of the sample weighting matrix are accumulated in the same bin of shift register 54. Shift register 54 must have as many storage bins as there are values of $m$ in the sample weighting matrix.

Accumulation of the discrete sampled outputs of multiplier 20 is not terminated until all values of $k$ in the sample weighting matrix have been run. In the sample weighting matrix shown in FIG. 2, this does not occur until $k=15$. During the sampling interval following sampling interval $k=15$, switch 56 operates to transmit the final accumulated values in each bin of shift register 54 to output node 60.

The time interval required to complete one frame of the sample weighting matrix and the number of cross-correlation coefficients contained in the matrix determine the degree of resolution of the frequency domain output signal. For a fixed sized sample weighting matrix a faster clock rate produces a shorter time interval between frames and a correspondingly lower degree of resolution of the unknown incoming signal. In this embodiment the output occurs each 10 milliseconds and represents a frequency domain output of the incoming time domain signal.

After the completion of each matrix frame, switch 56 resets the contents of each bin of shift register 54 to zero and the sequence begins again at the upper left-hand corner of the sample weighting matrix where $k=0$, $m=0$. If desired, a digital-to-analog converter can be connected to output node 60 to provide a continuous frequency spectrum display which would permit observation of the output on an oscilloscope.

This resulting accumulation in each bin of shift register 54 corresponds to a reordered double subscripted summation of the Discrete Fourier Transform. For example, the first bin performs the integration of $f_1(t_1) + f_1(t_2) + \ldots + f_1(t_K)$, where $f_1$ corresponds to the cross-correlation function present in the first row of the sample weighting matrix and where $t_1, t_2, \ldots, t_K$ correspond to each of the sampling intervals contained in the sample weighting matrix. This sequence is exactly opposite from the standard Fourier transform summation. During each sampling interval, $(t_1, t_2, \ldots, t_K)$ designated by each value of $k$ this apparatus is essentially holding the value of $t$ constant while the cross-correlation coefficients for that sampling interval are scanned, multiplied with the incoming signal and accumulated.

This unusual procedure allows the incoming signal to be processed in real time. Updated output data in frequency spectrum form flows into node 60 immediately upon the completion of each sample weighting matrix frame. All processing occurs while the samples of the incoming signal are being taken. Not even during the one sampling interval per frame when the output takes place is it necessary to ignore the incoming signal. The single storage device accumulates and stores only fully processed data. No other memory devices are required.

One important advantage of the design used in code generator 30 is that no memory is required to store the sample weighting matrix coefficients. The actual sample weighting matrix used in the apparatus shown in FIG. 1 may be much much larger than the example shown in FIG. 2 which contains only 128 cross-correlation coefficients. For example, the apparatus shown in functional block form in FIG. 1 actually uses a sample weighting matrix of dimension 128 × 64 which contains 8192 different cross-correlation coefficients. According to prior art, an 8192 bit programmed read only memory device would have been used to handle this number of cross-correlation coefficients. This would be too bulky and costly for many applications where smaller size and cost are called for.

An actual circuit of code generator 30 of the present invention reduced to practice which is used in place of an 8192 bit programmed read-only-memory only uses only a few standard integrated circuit chips. The use of this relatively simple circuitry was permitted by recognizing the existence of a repetitive pattern in the sample weighting matrix from which an algorithm could be constructed to produce the sample weighting matrix of code generator 30. The manner in which this repetitive pattern was produced is described below.

Each horizontal row of the sample weighting matrix represents a different frequency cross-correlation function. Reading horizontally across any given row produces a digital approximation of a fixed frequency sine wave. It was determined that there should be an integral number of complete cycles of the cross-correlation function in each row of the sample weighting matrix. There is no requirement that there be any coherent phase relationship between the various harmonically related cross-correlation waveforms for the frequency spectrum analyzer to operate properly. It was found, however, that by arranging all of the cross-correlation waveforms to have the same starting phase, that is, to start at the same point in a cycle, that a repetitive pattern similar to the horizontal pattern was produced in the vertical columns.

In the sample weighting matrix shown in FIG. 2, for sampling interval $k=0$ for all values of $m$, the value of the cross-correlation coefficient is 8. Each of the cross-correlation functions begins at a peak level equal to 8. All of the cross-correlation functions therefore begin in phase. By arranging the cross-correlation waveforms in this manner, it can now be seen that by reading vertically down each column a digital approximation to another series of harmonically related sine waves is produced. The vertical column designated by $k=0$ corresponds to the DC frequency. For the column designated by $k=1$, the value of the cross-correlation coefficients decreases from 8 to 1. This corresponds to one half of one cycle of a digitally approximated sine wave. For interval $k=2$ the value of the cross-correlation coefficients goes from 8 to 0 back up to 6 which is very close to a digitally approximated sine wave twice the frequency to that present in sampling interval $k=1$. Thus the harmonic relationship which was known to exist between the rows of the sample weighting matrix has now been extended to exist in the columns of the sample weighting matrix. The recognition of this unique relationship and the ability to rearrange the phases of the cross-correlation functions to produce this relationship allowed a code generator to be designed utilizing this pattern recognition to generate a simple linear progression which would produce all of the cross-correlation coefficients in the sample weighting matrix.

The correspondence between an optimal sample weighting matrix and the values produced by this linear progression is not exact but the error produced by this approximation was found to be minimal and does not appreciably degrade the accuracy of the spectrum analyzer output.

Use of a programmed read only memory in code generator 30 still remains an option. If in the future inexpensive programmed read only memory chips are produced, they could easily be incorporated into this apparatus and would produce a slightly more accurate output.

Figure 4:
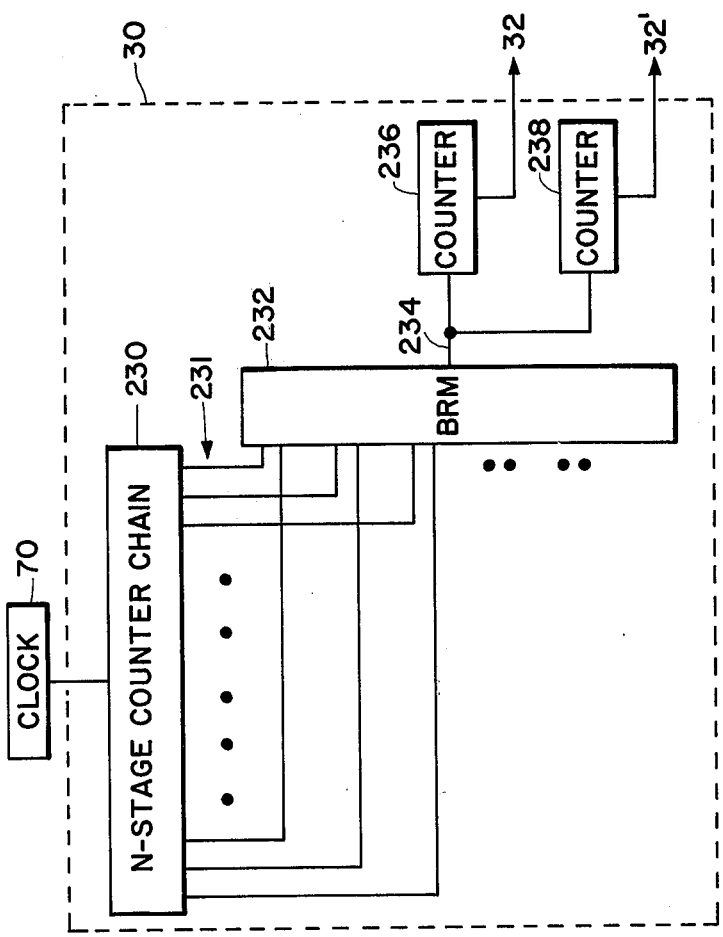
FIG. 4 is a block diagram representation of the code generator.

FIG. 4 shows an illustrative embodiment of a code generator that generates the harmonically related cross-correlation functions. The discovery that the cross-correlation waveforms shown in the sample weighting matrix in FIG. 2 could be arranged in such a way that there is numerical symmetry both in the vertical and horizontal direction led to the use of a binary rate multiplier (BRM) 232 in the arrangement shown in FIG. 4. BRM 232 can be any suitable conventional BRM circuit. N-stage counter chain 230 of conventional design is driven by clock 70 and generates a plurality of pulse trains of harmonically related repetition rates at its outputs 231. BRM 232 selectively combines these harmonically related pulsed outputs 231 to generate an output pulse train at output 234 where the rate thereof is proportional to the frequencies of the digitally approximated sine waves found in the vertical columns of the sample weighting matrix. The BRM output at the output terminal 234 can then be used to drive counter 236 to produce a series of sampling pulses at output 32 which represent the cross-correlation coefficients in each column of the sample weighting matrix. As an additional feature, there is provided another counter 238 coupled to BRM output 234 and set to start in a different state from counter 236. Counter 238 generates a series of cross-correlation waveforms at its output 32' which represent a quadrature or 90° phase shifted sample weighting matrix. This phase shifted output 32' can be used in a two channel frequency spectrum analyzer to be described below.

Figure 5:
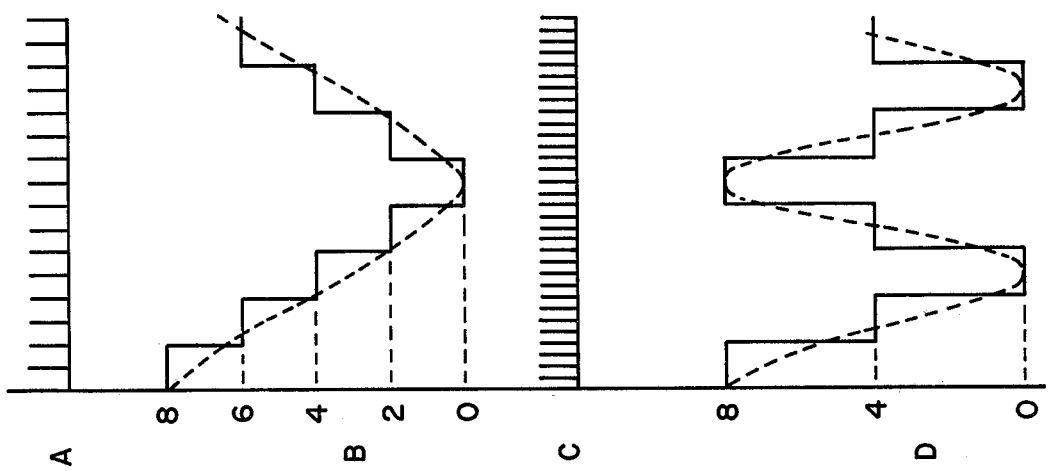
FIG. 5 shows two sets of code generator waveforms.

FIG. 5 shows the BRM output 234 produced during two sampling intervals defined by columns $k=2$ and $k=3$ in the sample weighting matrix shown in FIG. 2. The dotted line in FIG. 5B and 5D shows the sine wave which has been digitally approximated by code generator 30. The first series of BRM pulses shown in FIG. 5A causes code generator 30 to produce the series sampling pulses shown in FIG. 5B which correspond to sampling interval $k=2$. The next series of BRM pulses shown in FIG. 5C generates the wavefrom shown in FIG. 5D during sampling interval $k=3$. This process continues until all columns of the sample weighting matrix have been produced. The process then repeats itself.

This method of cross-correlation function generation using a BRM is particularly adaptable to a sample weighting matrix arrangement where all of the cross-correlation waveforms begin at the same starting phase. If for any reason it is desired to arrange the cross-correlation functions in the sample weighting matrix with a random order of starting phases, a programmable read-only-memory could be used in place of BRM 232.

One of the primary uses of the apparatus shown in FIG. 1 is to determine the Doppler shift caused by a target moving relative to a radar contained in an air-to-air missile. The apparatus shown in FIG. 1 is limited to ananlyzing either a positive closure rate or a negative closure rate. It is unable to discriminate between positive and negative closure rates. Since normally it is highly desirable to be able to detect both positive and negative closure rates, the two channel apparatus shown in FIG. 6 was devised.

For two channel operation the unknown incoming signal is first transmitted to a two quadrature modulator which has outputs 90° out of phase, one corresponding to an in phase signal and one corresponding to a quadrature signal. The in phase signal is sent to input node 2A while the quadrature signal is sent to input node 2B. The signals arriving at input nodes 2A and 2B are identical, but have been shifted 90° in phase. Analog-to-digital converters 3A and 3B hard limit the amplitude of the incoming signal components to either a one level or a zero level. The resulting pulsed outputs of analog-to-digital converters 3A and 3B are fed to multipliers 20A and 20B by means of conductors 10A and 10B. Code generator 30A generates two trains of sampling pulses which are coupled to multipliers 20A and 20B by output conductors 32A and 32B. The discrete sampled outputs from multipliers 20A and 20B are fed to sum and difference generator 80 by means of conductors 21A and 21B. Outputs 22A and 22B of sum and difference generator 80 are coupled to accumulators 50A and 50B. The outputs of accumulators 50A and 50B are sent to output nodes 60A and 60B.

Since the signal arriving at input node 2B is in quadrature with the signal arriving at input node 2A, the output of code generator 30A at output 32B should be 90° out of phase with code generator output 32A. Normally this would require generating an additional sample weighting matrix for use with the lower channel, but that would increase the size and complexity of the apparatus. Rather than doing this, the required 90° phase shift for use with lower channel output 32B is produced by adding a counter stage in the output stage of code generator 30A.

Figure 6:
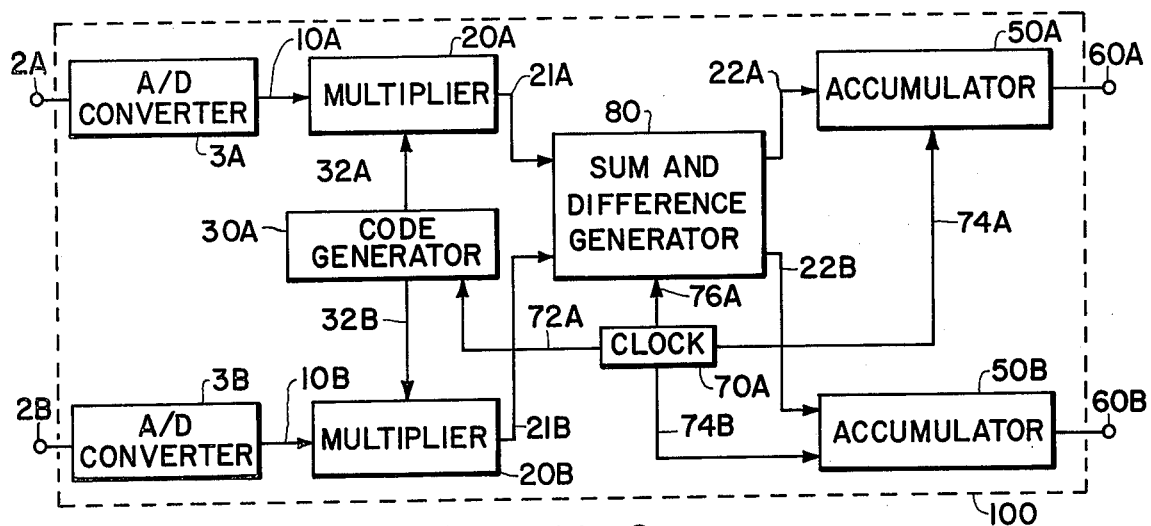
FIG. 6 is a block diagram of the current preferred embodiment of a two channel frequency spectrum analyzer.

The operation of each channel of the two channel apparatus shown in FIG. 6 is similar to that of the single channel apparatus shown in FIG. 1. The sequence of events is virtually the same in each apparatus.

In the two channel apparatus the incoming signal is separated into an in phase and a quadrature signal and a sum and difference generator is used to suppress unwanted images; this two stage process is used to great advantage in frequency spectrum analyzer 100. Sum and difference generator 80 could have been combined with the quadrature modulator ahead of frequency spectrum analyzer 100 so that signal separation would be complete prior to input nodes 2A and 2B. But this approach would have made it totally impossible to create the desired 90° phase shift for lower channel output 32B by adding only a single counter stage to code generator 30A. A duplicate code generator would have been required for use with the lower channel. By placing code generator 30A between the quadrature modulator and sum and difference generator 80 the need for a duplicate code generator for use in the lower channel has been eliminated. This results in having a more compact, more inexpensive apparatus than would have been the case otherwise. Code generator 30A shown in FIG. 6 has two outputs, 32A and 32B which simultaneously transmit sampling pulses to multipliers 20A and 20B. Output 32A corresponds exactly to output 32 of code generator 30 as shown in FIG. 1.

Conductors 21A and 21B transmit the outputs of multipliers 20A and 20B to a sum and difference generator 80. The purpose of sum and difference generator 80 is to complete the separation of the quadrature components of the incoming signal into an upper channel component and a lower channel component. The function of this device is well known in the art. Sum and difference generator 80 is clocked at a frequency twice that of the other clock outputs. During the first half of each sampling interval sum and difference generator 80 adds the output of multiplier 20A and the output of multiplier 20B and generates a sum signal at output 22A. During the second half of each sampling interval sum and difference generator 80 substracts the two signals present at its input and generates a difference signal at output 22B. During the first half of each sampling interval when sum and difference generator 80 is generating a sum signal, accumulator 50A accumulates and stores the sum signal coming from output 22A. During the second half of each sampling interval accumulator 50B accumulates and stores the difference signal coming from output 22B. The operation of accumulators 50A and 50B is virtually identical to that of accumulator 50 shown in FIG. 1. Accumulators 50A and 50B complete one sample weighting matrix frame in the same time period that accumulator 50 shown in FIG. 1 performed the function.

During the sampling interval following each matrix frame accumulators 50A and 50B generate an output which is transmitted to output nodes 60A and 60B. The signal at output 60A corresponds to a digital integration of all of the sum signals while the signal at output 60B corresponds to a digital integration of all of the difference signals. The signal at output node 60A represents the upper sideband element of a complete frequency spectrum output. Frequency components in this portion of the output signal correspond to positive closure rates. The signal at output node 60B represents the lower sideband element of a complete frequency spectrum output. Frequency components in this portion of the output signal correspond to negative closure rates. Thus with the apparatus shown in FIG. 6 one is able to determine the magnitude and sign of the closure rate between a target and the vehicle containing the frequency spectrum analyzer.

Several difficulties arise when only a two channel apparatus is used. Since there is no way to ascertain the phase angle of the unknown incoming signal, occasionally one frequency component of the unknown incoming signal may exactly equal the frequency of the cross-correlation waveform but be 90° out of phase. This produces a false null or zero output for that frequency component. When the phase angle of the cross-correlation waveform and the phase angle of the unknown incoming signal are in quadrature a two channel frequency spectrum analyzer produces a momentary unreliable indication. Depending on the application this anomaly in the output may be undesirable.

Figure 7:
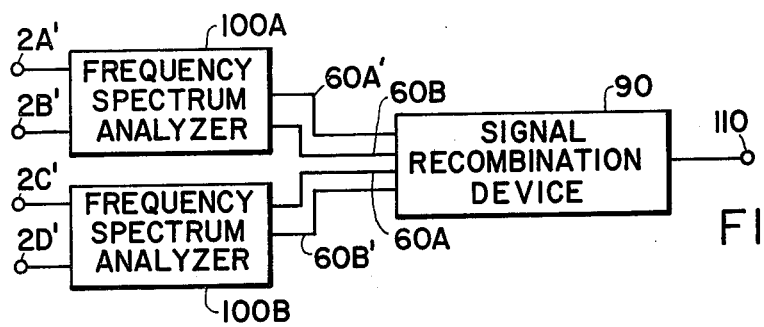
FIG. 7 is a block diagram of a pair of two channel frequency spectrum analyzers coupled together to eliminate any possible phasing sensitivity problems.

This phase sensitivity problem is a well known effect which can be eliminated by using the arrangement shown in FIG. 7. A first two channel frequency spectrum analyzer 100A has an in phase input signal connected to input node 2A' and a quadrature input connected to input node 2B'. The output of frequency spectrum analyzer 100A is transmitted by output lines 60A and 60B to signal recombination device 90. A second two channel frequency spectrum analyzer 100B has its inputs connected in just the opposite manner. Here the in phase input signal is connected to input node 2D' and the quadrature input signal is connected to input node 2C'. The output of frequency spectrum analyzer 100B is transmitted by output lines 60A' and 60B' to signal recombination device 90. Signal recombination device 90 uses a sum of the squares method or some other well known method to recombine the two separate output signals from the individual two channel frequency spectrum analyzers into a single output signal which can be obtained from output node 110.

Now when any given frequency component of the unknown incoming signal is in quadrature with one of the cross-correlation waveforms in one of the frequency spectrum analyzers, it will be in phase with the corresponding cross-correlation waveform of the other frequency spectrum analyzer. There will never be a time when the phase of the unknown incoming signal and the phase of both first frequency spectrum analyzer 100A and second frequency spectrum analyzer 100B will all be arranged such that a false null will be produced. This results from the fact that the two frequency spectrum analyzers are operating on input signals of opposite 90° phase shifts. This phase sensitivity problem is the sole reason for using a pair of two channel frequency spectrum analyzers.

The various adaptation described above as well as other modifications may be made within the scope of the present invention. For example, the frequency response of the spectrum analyzer may be increased by utilizing newer digital logic with faster response times. Another possibility would be to increase the number of channels into which the incoming signal is divided and processed. The basic conceptual foundation for these changes remains the same.

Figure 8:
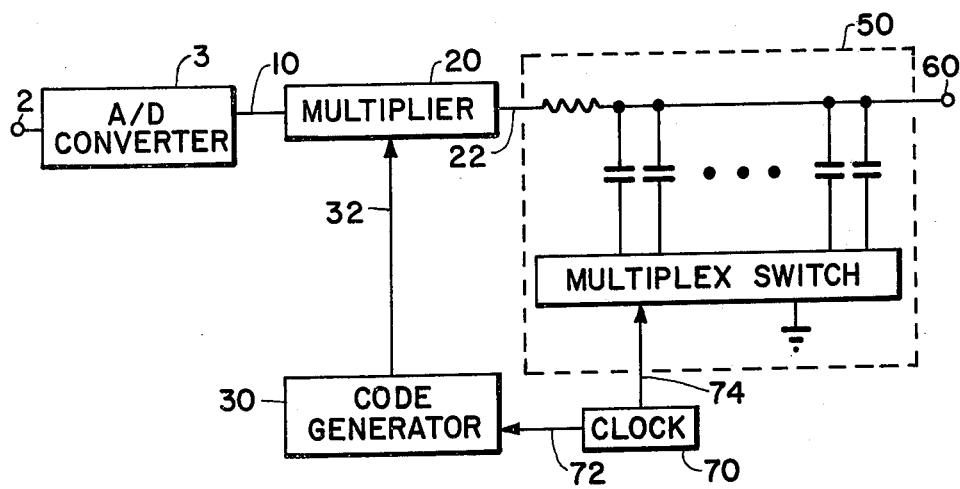
FIG. 8 shows a possible alternative construction of the frequency spectrum analyzer using an analog accumulating means.

Accumulator 50 shown in FIG. 8 uses commutated capacitors and represents one possible analog embodiment of this invention. This arrangement utilizes the same basic concepts as the digital embodiment shown in FIG. 1.

In conclusion, the invention system provides a new apparatus for analyzing in real time the frequency spectrum of an incoming signal of unknown frequency characteristics. The apparatus was developed for use in a completely self-contained air-to-air missile guidance system which is able to process radar signals reflected from the missile's target. As presently constructed, the apparatus is able to determine the magnitude and direction of the closure rate between a missile and its target. This apparatus has a combination of small size, low cost and low power consumption which has not been equalled by prior art. This invention system is sufficiently inexpensive and compact to permit use in a missile guidance system. It also satisfies the requirements for extremely short processing times and outputs of extremely high reliability and accuracy. While this invention system was designed for use with Doppler radar information it could also be adapted for use with sonar, speech coding and recognition, and certain kinds of fast video filtering.

What is claimed is:

1. An apparatus for analyzing in real time the frequency spectrum of an incoming signal of unknown frequency characteristics which has been separated into two quadrature components, comprising:
   means for receiving and limiting the amplitude of each quadrature component;
   means for generating a timing signal;
   means responsive to the timing signal for generating first and second trains of sampling pulses in repetitive frames, wherein each frame of said first and said second trains of sampling pulses represents a series of cross-correlation functions in terms of a predetermined number of sampling intervals and a predetermined number of harmonics;
   first means for multiplying said first train of sampling pulses with said first quadrature signal component to generate a first train of discrete sampled outputs;
   second means for multiplying said second train of sampling pulses with said second quadrature signal component to generate a second train of discrete sampled outputs;
   means for separating said first and said second train of discrete sampled outputs into two completely separated upper and lower channel sampled output signals;
   first means responsive to the timing signal for accumulating said upper channel sampled outputs and generating an upper sideband frequency domain output signal for each frame of sampling pulses; and
   second means responsive to the timing signal for accumulating said lower channel sampled outputs and generating a lower sideband frequency domain output signal for each frame of sampling pulses.

2. The apparatus according to claim 1, wherein said means for generating said first and said second trains of sampling pulses is interposed between said receiving means and said separating means.

3. The apparatus according to claim 1, wherein said apparatus is adapted to permit detection and measurement of both positive and negative Doppler shifts.

4. A method of analyzing in real time the frequency spectrum of an incoming signal of unknown frequency characteristics wherein said incoming signal is divided into in phase and quadrature components, comprising the steps of:
   a. generating a timing signal;
   b. generating a first and a second train of sampling pulses said second train being quadrature phase shifted from said first train, wherein said sampling pulses appear in repetitive frames in response to the timing signal, wherein each frame of pulses represents a series of cross-correlation functions in terms of a predetermined number of sampling intervals and a predetermined number of harmonics;
   c. multiplying said first train of sampling pulses with the in phase component of the incoming signal to generate a first train of discrete sampled outputs, multiplying said second train of sampling pulses with the quadrature component of the incoming signal to generate a second train of discrete sampled outputs;
   d. separating said first and said second discrete sampled outputs into two completely separate upper and lower channel sampled output signals; and
   e. accumulating said upper channel sampled outputs in response to the timing signal and generating an upper sideband frequency domain output signal for each frame of the sampling pulses and accumulating said lower channel sampled outputs in response to the timing signal and generating a lower sideband frequency domain output signal for each frame of sampling pulses.

5. A frequency spectrum analyzer system comprising a first and a second apparatus of the type set forth in claim 1, wherein said first and second apparatus are coupled to receive the in phase and quadrature components of an incoming signals in opposite sense, each apparatus generating a single frequency domain output signal for each frame of sampling pulses, means for combining the output of said first and second apparatus into a single output signal representing a frequency spectrum analysis of the incoming time domain signal in which the inaccuracy due to phasing sensitivity is eliminated.

6. A method of analyzing in real time the frequency spectrum of an incoming signal of unknown frequency characteristics, wherein said incoming signal is divided into a first and a second pair of in phase and quadrature components, comprising the steps of receiving and processing the two pairs of quadrature incoming signal components in opposite sense set forth in claim 14 for generating an upper and lower channel frequency domain output signal, and combining the two output signals into a single frequency domain output signal for each frame of sampling pulses whereby the inaccuracy caused by phasing sensitivity is eliminated.

7. An apparatus according to claim 6, wherein said output signal combining device is adapted to combine said upper and lower channel frequency domain output signals into a single frequency domain output signal by summing the squares those signals and then taking the square root of that sum.

8. An apparatus for analyzing in real time the frequency spectrum of an incoming signal of unknown frequency characteristics, comprising:
   a. means for generating a timing signal;
   b. means responsive to the timing signal for generating a train of sampling pulses in repetitive frames wherein each frame of the pulses represents a series of cross-correlation functions in terms of a predetermined number of sampling intervals and a predetermined number of harmonics and each frame is representable by a sample weighting matrix composed of vertical columns and horizontal rows, where the number of columns in the sample weighting matrix determines the number of sampling intervals which constitute a complete frame of sampling pulses, and where the number of rows in the sample weighting determines the number of harmonically related cross-correlation functions;
   c. means for multiplying the sampling pulses with the incoming signal to generate a train of discrete sampled outputs; and
   d. means responsive to the timing signal for accumulating the discrete sampled outputs from said multiplying means and generating an output signal for each frame of sampling pulses.

9. An apparatus for analyzing in real time the frequency spectrum of an incoming signal of unknown frequency characteristics, comprising:
   a. means for generating a timing signal;
   b. means responsive to the timing signal for generating a train of sampling pulses in repetitive frames wherein each frame of pulses represents a series of cross-correlation functions in terms of a predetermined number of sampling intervals and a predetermined number of harmonics;
   c. means for multiplying the sampling pulses with the incoming signal to generate a train of discrete sampled outputs; and
   d. means responsive to the timing signal for accumulating the discrete sampled outputs from said multiplying means and generating a frequency domain output signal for each frame of sampling pulses during the sampling interval following each frame of sampling pulses.

10. An apparatus for analyzing in real time the frequency spectrum of an incoming signal of unknown frequency characteristics, comprising:
    a. means for generating a timing signal;
    b. means responsive to the timing signal for generating a train of sampling pulses in repetitive frames wherein each frame of pulses represents a series of cross-correlation functions in terms of a predetermined number of sampling intervals and a predetermined number of harmonics;
    c. means for multiplying the sampling pulses with the incoming signal to generate a train of discrete sampled outputs; and
    d. means responsive to the timing signal for accumulating the discrete sampled outputs from said multiplying means and generating a frequency domain output signal for each frame of sampling pulses, said accumulating means including digital integrating means responsive to the timing signal for summing in succession over a complete frame of sampling intervals the discrete sampled outputs produced during each sampling interval.

11. The apparatus according to claim 10, wherein said digital integrating means includes a recirculating shift register having a number of storage positions corresponding to the number of rows in the sample weighting matrix, means for resetting the storage positions of said recirculating shift register to zero during the sampling interval following each frame of sampling pulses, and means for switching out the accumulated contents of said shift register during the sampling interval following each frame of sampling pulses.

12. An apparatus for analyzing in real time the frequency spectrum of an incoming signal of unknown frequency characteristics, comprising:
    a. means for generating a timing signal;
    b. means responsive to the timing signal for generating a train of sampling pulses in repetitive frames wherein each frame of pulses in represents a series of cross-correlation functions in terms of a predetermined number of sampling intervals and a predetermined number of harmonics;
    c. means for multiplying the sampling pulses with the incoming signal to generate a train of discrete sampled outputs; and
    d. means responsive to the timing signal for accumulating the discrete sampled outputs from said multiplying means and generating a frequency domain output signal for each frame of sampling pulses, said accumulating means including a parallel filter bank having commutated capacitors switched in response to the timing signal for summing in succession over a complete frame of sampling intervals the discrete sampled outputs produced during each sampling interval.

13. An apparatus for analyzing in real time the frequency spectrum of an incoming signal of unknown frequency characteristics, comprising:
    a. means for generating a timing signal;
    b. means responsive to the timing signal for generating a train of sampling pulses in repetitive frames wherein each frame of pulses represents a series of cross-correlation functions in terms of a predetermined number of sampling intervals and a predetermined number of harmonics, said means for generating sampling pulses being adapted to implement an algorithm based on an arrangement of the sample weighting matrix which contains a repetitive relationship between the numbers found in the rows of said sample weighting matrix and the numbers found in the columns of said sample weighting matrix;
    c. means for multiplying the sampling pulses with the incoming signal to generate a train of discrete sampled outputs; and
    d. means responsive to the timing signal for accumulating the discrete sampled outputs from said multiplying means and generating an output signal for each frame of sampling pulses.

14. An apparatus for analyzing in real time the frequency spectrum of an incoming signal of unknown frequency characteristics, comprising:
    a. means for generating a timing signal;

b. means responsive to the timing signal for generating a train of sampling pulses in repetitive frames wherein each frame of pulses represents a series of cross-correlation functions in terms of a predetermined number of sampling intervals and a predetermined number of harmonics;
c. means for multiplying the sampling pulses with the incoming signal to generate a train of discrete sampled outputs;
d. means responsive to the timing signal for accumulating the discrete sampled outputs from said multiplying means and generating a frequency domain output signal for each frame of sampling pulses; and
e. said apparatus being adapted to analyze in two channels said incoming signal in the form of in phase and quadrature components, comprising means for partially processing the unknown incoming signal which has been separated into its quadrature components, means for completing the signal separation to provide two separate signal components, and means for further processing said two signal components to derive said frequency domain output signal.

15. An apparatus for analyzing in real time the frequency spectrum of an incoming signal of unknown frequency characteristics, comprising:
a. means for generating a timing signal;
b. means responsive to the timing signal for genrerating a train of sampling pulses in repetitive frames wherein each frame of pulses represents a series of cross-correlation functions in terms of a predetermined number of sampling intervals and a predetermined number of harmonics, said means for generating sampling pulses including means for generating a series of amplitude quantized sinusoidal cross-correlation waveforms;
c. means for multiplying the sampling pulses with the incoming signal to generate a train of discrete sampled outputs; and
d. means responsive to the timing signal for accumulating the discrete sampled outputs from said multiplying means and generating a frequency domain output signal for each frame of sampling pulses.

16. An apparatus for analyzing in real time the frequency spectrum of an incoming signal of unknown frequency characteristics, comprising:
a. means for generating a timing signal;
b. means responsive to the timing signal for generating a train of sampling pulses in repetitive frames wherein each frame of pulses represents a series of cross-correlation functions in terms of a predetermined number of sampling intervals and a predetermined number of harmonics, said means for generating sampling pulses including means for generating a series of amplitude quantized cosine cross-correlation waveforms;
c. means for multiplying the sampling pulses with the incoming signal to generate a train of discrete sampled outputs; and
d. means responsive to the timing signal for accumulating the discrete sampled outputs from said multiplying means and generating a frequency domain output signal for each frame of sampling pulses.

17. An apparatus for analyzing in real time the frequency spectrum of an incoming signal of unknown frequency characteristics, comprising:
a. means for generating a timing signal;
b. means responsive to the timing signal for generating a train of sampling pulses in repetitive frames wherein each frame of pulses represents a series of cross-correlation functions in terms of a predetermined number of sampling intervals and a predetermined number of harmonics, said means for generating sampling pulses including means for generating a series of amplitude quantized sin cross-correlation waveforms;
c. means for multiplying the sampling pulses with the incoming signal to generate a train of discrete sampled outputs; and
d. means responsive to the timing signal for accumulating the discrete sampled outputs from said multiplying means and generating a frequency domain output signal for each frame of sampling pulses.

18. An apparatus for analyzing in real time the frequency spectrum of an incoming signal of unknown frequency characteristics, comprising:
a. means for generating a timing signal;
b. means responsive to the timing signal for generating a train of sampling pulses in repetitive frames wherein each frame of pulses represents a series of cross-correlation functions in terms of a predetermined number of sampling intervals and a predetermined number of harmonics, said means for generating sampling pulses including an N-stage counter chain, a binary rate multiplier and a counter operatively coupled to derive said train of sampling pulses in response to the timing signal;
c. means for multiplying the sampling pulses with the incoming signal to generate a train of discrete sampled outputs; and
d. means reponsive to the timing signal for accumulating the discrete sampled outputs from said multiplying means and generating a frequency domain output signal for each frame of sampling pulses.

* * * * *